(12) United States Patent
Ito et al.

(10) Patent No.: US 9,155,207 B2
(45) Date of Patent: Oct. 6, 2015

(54) METHOD FOR PRODUCING AN ANISOTROPIC CONDUCTIVE FILM

(75) Inventors: Masahiko Ito, Tochigi (JP); Daisuke Masuko, Tochigi (JP)

(73) Assignee: DEXERIALS CORPORATION, Tokyo (JP)

( * ) Notice: Subject to any disclaimer, the term of this patent is extended or adjusted under 35 U.S.C. 154(b) by 434 days.

(21) Appl. No.: 13/606,994

(22) Filed: Sep. 7, 2012

(65) Prior Publication Data

US 2012/0328794 A1 Dec. 27, 2012

Related U.S. Application Data

(60) Division of application No. 12/727,346, filed on Mar. 19, 2010, now abandoned, which is a continuation of application No. PCT/JP2008/065686, filed on Sep. 1, 2008.

(30) Foreign Application Priority Data

Sep. 20, 2007 (JP) ................. 2007-244145
Nov. 29, 2007 (JP) ................. 2007-308451

(51) Int. Cl.
*H01R 9/00* (2006.01)
*H05K 3/32* (2006.01)
*H05K 3/10* (2006.01)

(52) U.S. Cl.
CPC ............... *H05K 3/323* (2013.01); *H05K 3/102* (2013.01); *H05K 2203/105* (2013.01); *H05K 2203/1344* (2013.01); *H05K 2203/1355* (2013.01); *H05K 2203/1366* (2013.01); *Y10T 428/25* (2015.01)

(58) Field of Classification Search
USPC ............ 361/749; 174/250–254; 428/220, 356
See application file for complete search history.

(56) References Cited

U.S. PATENT DOCUMENTS

| | | | |
|---|---|---|---|
| 5,783,465 A | 7/1998 | Canning et al. | |
| 5,903,056 A | 5/1999 | Canning et al. | |
| 6,269,209 B1* | 7/2001 | Terada et al. | 385/51 |
| 7,078,095 B2 | 7/2006 | Tam | |
| 2001/0021547 A1 | 9/2001 | Sakairi | |
| 2006/0121745 A1 | 6/2006 | Fujii | |
| 2006/0188661 A1* | 8/2006 | Hirai et al. | 427/533 |
| 2006/0262163 A1* | 11/2006 | Nishio et al. | 347/55 |

(Continued)

FOREIGN PATENT DOCUMENTS

| | | |
|---|---|---|
| JP | 63-102110 A | 5/1988 |
| JP | 02-306558 A | 12/1990 |
| JP | 2000-149677 A | 5/2000 |

(Continued)

OTHER PUBLICATIONS

International Search Report (PCT/ISA/210) for PCT/JP2008/065686 dated Sep. 22, 2008.

(Continued)

*Primary Examiner* — Tuan T Dinh
(74) *Attorney, Agent, or Firm* — Buchanan, Ingersoll & Rooney PC

(57) ABSTRACT

An anisotropic conductive film, containing a resin film; and conductive particles aligned into a monolayer within the resin film adjacent to or on one plane of the resin film with respect to a thickness direction of the resin film, wherein a distance between the one plane of the resin film and a center of the conductive particle is 9 μm or less based on 10-point average.

6 Claims, 6 Drawing Sheets

(56) References Cited

U.S. PATENT DOCUMENTS

2007/0015091 A1* 1/2007 Miyake et al. ............... 430/321
2007/0065957 A1* 3/2007 Fujii et al. ..................... 438/16

FOREIGN PATENT DOCUMENTS

| | | |
|---|---|---|
| JP | 2001-052778 A | 2/2001 |
| JP | 2002-075580 A | 3/2002 |
| JP | 2002-358825 A | 12/2002 |
| JP | 2003-064324 A | 3/2003 |
| JP | 2006-032335 A | 2/2006 |
| JP | 2006-093020 A | 4/2006 |
| JP | 2007-016088 A | 1/2007 |
| JP | 2007-115560 A | 5/2007 |

OTHER PUBLICATIONS

Written Opinion (PCT/ISA/237) for PCT/JP2008/065686 dated Sep. 22, 2008.

International Preliminary Report on Patentability (PCT/IPEA/409) for PCT/JP2008/065686 dated Sep. 20, 2007.

* cited by examiner

METHOD FOR PRODUCING AN ANISOTROPIC CONDUCTIVE FILM

CROSS-REFERENCE TO RELATED APPLICATIONS

This application is a divisional of application Ser. No. 12/727,346, filed Mar. 19, 2010, which is a continuation of Application No. PCT/JP2008/065686, filed on Sep. 1, 2008, which in turn claims priority to Japanese Application Nos. 2007-244145, filed Sep. 20, 2007 and 2007-308451, filed Nov. 29, 2007, the entire content of each of which is incorporated herein by reference.

BACKGROUND OF THE INVENTION

1. Field of the Invention

The present invention relates to an anisotropic conductive film capable of electrically and mechanically connecting an electronic part (e.g. IC chip, and a liquid crystal display (LCD) panel in a liquid crystal display (LCD)) and a substrate, or connecting substrates, and also relates to a joined structure using the anisotropic conductive film.

Moreover, the present invention also relates to a method for producing an isotropic conductive film (a film containing aligned particles) in which conductive particles aligned into a monolayer at a pitch of micron-order in a resin film.

2. Description of the Related Art

Anisotropic conductive films (ACF) have conventionally been used as means for connecting electronic parts and a circuit board, and the like. The anisotropic conductive film is used for adhering and electrically connecting various terminals to each other, including the case for connecting a flexible print circuit or terminals of IC chip to an indium tin oxide (ITO) electrode formed on a glass substrate of a LCD panel.

As for the anisotropic conductive film, the film in which conductive particles are dispersed in an epoxy resin-based insulating adhesive layer is generally used. For example, the electrical connection between the terminal of the IC chip and the ITO electrode is realized by holding and crushing the conductive particles between the terminal of the IC chip and the ITO electrode of the glass substrate.

The area of the contact terminal is reduced as the contact terminals are arranged at finer pitch due to the recent trends of the electronic devices, such as downsizing and having higher performance. Although the area of the terminal is reduced, it is still desired to maintain the high conduction reliability.

Since the conductive particles are dispersed in the insulating adhesive layer, the anisotropic conductive film has a problem such that the conductive particles are moved along with the movement of the insulating adhesive agent by heating and contact bonding at the time of the connection. To make the electrical connection secure, it is necessary to make the number of the conductive particles on the terminal at a certain level or larger after the connection. Therefore, it is also necessary to increase the number of the conductive particles to be contained in the insulating adhesive layer.

To this end, it has been desired to develop an anisotropic conductive film which suppresses the movement of the conductive particles, increases the capturing rate of the conductive particles at the terminal, and improves the conduction reliability, by regularly aligning the conductive particles on one plane of the insulating adhesive layer in the thickness direction.

For example, the following methods have been known as the method for producing an anisotropic conductive film in which the conductive particles are regularly aligned (the method for aligning the conductive particles on the electrode terminal or wiring for the purpose of the production of the anisotropic conductive film).

Japanese Patent Application Laid-Open (JP-A) No. 2006-32335 discloses an anisotropic conductive film in which conductive particles are disposed at a surface of an insulating adhesive layer, and proposes, as a method for evenly disposing the conductive particles in a surface layer of the insulating adhesive layer, a system such that the conductive particles are charged so as to have an identical electric charge, and are sprayed. In this system, however, the charge of the conductive particles can be lost within only several tens seconds, it is difficult to maintain the aligned state of the conductive particles on the insulating adhesive layer.

Moreover, JP-A 2002-75580 discloses a method for producing an anisotropic conductive film in which conductive particles are disposed only in a certain region, and proposes, as a method for disposing the conductive particles only in the certain region, a method in which a voltage is applied to the conductive particles, and the conductive particles are splayed at the region of the adhesive layer corresponding to the electrode by means of a mask which has an opening at the region corresponding to the electrode on the substrate. In this method, however, the electric charge of the conductive particles are diffused as the thickness of the adhesive layer is increased, and thus the fine alignment of the particles corresponding to the electrode cannot be attained.

Moreover, JP-A No. 2007-115560 discloses an anisotropic conductive film in which conductive particles are regularly aligned, and the production method thereof. This patent literature also proposes, as a method for regularly aligning the conductive particles, a method in which after spraying and aligning the conductive particles on a surface of an insulating adhesive layer which has been formed by applying the insulating adhesive on a substrate, an insulating adhesive is further applied thereon, or spraying the dispersion in which the conductive particles are dispersed in the insulating adhesive. In this method, however, the conductive particles are aggregated to each other if the pitch of the alignment of the conductive particles is reduced. Therefore, it is difficult to align the conductive particles into a monolayer.

Moreover, other than the methods mentioned above, for example, JP-A No. 2006.93020 discloses a method for producing an anisotropic conductive sheet and proposes a method for aligning the conductive particles by a magnet, using conductive magnetic particles as the conductive particles. In this method, however, the currently commercially available conductive particles cannot be used, and there is a problem in versatility.

Accordingly, it is a current situation that a simple method, which can align conductive particles into a monolayer in an insulating resin film at a pitch of micro order without causing the aggregation of the conductive particles, and align the conductive particles on one plane of the insulating resin film in the thickness direction thereof, has not been yet provided. There has been desired an anisotropic conductive film, which has excellent conduction reliability by suppressing the movement of conductive particles at the time of the connection between electronic part or the like and a substrate, and securing the high capturing rate of conductive particles, and developments of the relevant technique thereof.

BRIEF SUMMARY OF THE INVENTION

The present invention aims at solving the aforementioned problems in the art, and achieving the following objects. Namely, an object of the present invention is to provide an anisotropic conductive film which has excellent conduction reliability by suppressing the movement of conductive particles at the time of the connection between an electronic part or the like and a substrate, and securing the high capturing rate of the conductive particles, and to provide a joined structure of an electronic part or the like and a substrate, which has a high capturing rate of conductive particles and has excellent conduction reliability, formed by using the anisotropic conductive film.

Another object of the present invention is to provide a simple and efficient method for producing an anisotropic conductive film in which conductive particles aligned into a monolayer at a pitch of micro-order in a resin film.

The means for solving the aforementioned problems are as follows:

<1> An anisotropic conductive film, containing:
   a resin film; and
   conductive particles aligned into a monolayer within the resin film, and adjacent to or on one plane of the resin film with respect to a thickness direction of the resin film,
   wherein a distance between the one plane of the resin film and a center of the conductive particle is 9 μm or less based on 10-point average.

In the anisotropic conductive film according to <1>, the conductive particles are aligned into a monolayer adjacent to or on one plane of the resin film with respect to the thickness direction thereof, and the center of the conductive particle is distant from 9 μm or less. Accordingly, when an electronic part or the like and a substrate are joined using the anisotropic conductive film, the conductive particles are not easily influenced by the flow of the resin, and are captured by a connection terminal at high ratio, providing excellent conduction reliability.

<2> The anisotropic conductive film according to <1>, wherein a distance between a center of the conductive particle and a center of the adjacent conductive particle is 1 μm to 30 μm based on 10-point average.

<3> The anisotropic conductive film according to any of <1> or <2>, wherein the anisotropic conductive film is obtained by simultaneously spraying the conductive particles, to which electrostatic potential is applied by an electrostatic potential applying unit, by means of one spraying unit, and resin particles by means of another spraying unit onto a processing surface so as to align the conductive particles into a monolayer within the resin film formed of the resin particles.

In the anisotropic conductive film according to <3>, the conductive particles to which the electrostatic potential is applied and the resin particles are separately ejected from the respective spraying units, and are simultaneously sprayed on the processing surface. Therefore, the resin particles are deposited to form the resin film in the state such that the location of the conductive particles is stably secured on the processing surface. As a result, the anisotropic conductive film, in which the conductive particles are aligned adjacent to or on one plane of the resin film with respect to the thickness direction of the resin film at a pitch of micro-order, is obtained.

<4> The anisotropic conductive film according to any one of <1> to <3>, wherein the resin film is formed of at least one insulating resin selected from an epoxy resin and an acrylic resin.

<5> A joined structure, containing:
   the anisotropic conductive film as defined in any one of <1> to <4>; and
   at least two members selected from electronic parts and substrates,
   wherein the at least two members are electrically joined via the anisotropic conductive film.

In the joined structure according to <5>, at least two member selected from the electronic parts and the substrates are electrically connective by using the anisotropic conductive film of the present invention, and thus it has the high capturing rate of the conductive particles and has excellent conduction reliability.

<6> The joined structure according to <5>, wherein the at least two members selected from the electronic parts and the substrates have a connection terminal having an area in the range of 600 μm² or more but less than 1,800 μm².

<7> The joined structure according to any of <5> or <6>, wherein the electronic part, is selected from IC chip and a liquid crystal display panel, and the substrate is selected from ITO glass substrate, a flexible substrate, a rigid substrate, and a flexible print substrate.

<8> A method for producing an anisotropic conductive film, containing:
   simultaneously spraying conductive particles, to which electrostatic potential is applied by means of an electrostatic potential applying unit, from one spraying unit, and resin particles from another spraying unit on a processing surface so as to align the conductive particles within a resin film formed of the resin particles.

In the method for producing an anisotropic conductive film according to <8>, the conductive particles to which the electrostatic potential is applied and the resin particles are separately ejected from the respective spraying units, and are simultaneously sprayed on the processing surface. Therefore, the resin particles are deposited to form the resin film in the state such that the location of the conductive particles is stably secured on the processing surface. As a result, the anisotropic conductive film, in which the conductive particles are aligned adjacent to or on one plane of the resin film with respect to the thickness direction of the resin film at a pitch of micro-order, is obtained.

<9> The method for producing an anisotropic conductive film according to <8>, wherein the resin particles are formed of at least one insulating resin selected from an epoxy resin and an acrylic resin.

<10> The method for producing an anisotropic conductive film according to any of <8> or <9>, wherein the electrostatic potential of the conductive particles is in the range of 300 V to 1,500 V.

<11> The method for producing an anisotropic conductive film according to any one of <8> to <10>, wherein the conductive particles sprayed from the spraying unit travel to the processing surface at the speed of 0.3 m/min or slower.

<12> The method for producing an anisotropic conductive film according to any one of <8> to <11>, wherein the spraying unit contains a nozzle.

<13> The method for producing an anisotropic conductive film according to <12>, wherein the nozzle has a diameter of 0.1 mm to 1.0 mm.

<14> The method for producing an anisotropic conductive film according to any one of <8> to <13>, wherein a 10-point average of a distance between a center of the conductive particle and a center of the adjacent conductive particle in the resin film is 1 μm to 30 μm.

<15> The method for producing an anisotropic conductive film according to any one of <8> to <14>, wherein a distance between a center of the conductive particle in the resin film and the processing surface is 9 μm or less based on 10-point average.

<16> The method for producing an anisotropic conductive film according to any one of <8> to <15>, wherein the processing surface has a conductive pattern, and the conductive particles are selectively aligned on the conductive pattern.

According to the present invention, there can be provided an anisotropic conductive film which has excellent conduction reliability by suppressing the movement of conductive particles at the time of the connection between an electronic part or the like and a substrate, and securing the high capturing rate of the conductive particles, as well as a joined structure of an electronic part or the like and a substrate, which has a high capturing rate of conductive particles and has excellent conduction reliability, formed by using the anisotropic conductive film.

According to the present invention, moreover, there can be provided a simple and efficient method for producing an anisotropic conductive film in which conductive particles aligned into a monolayer at a pitch of micro-order in a resin film.

Figure 1:
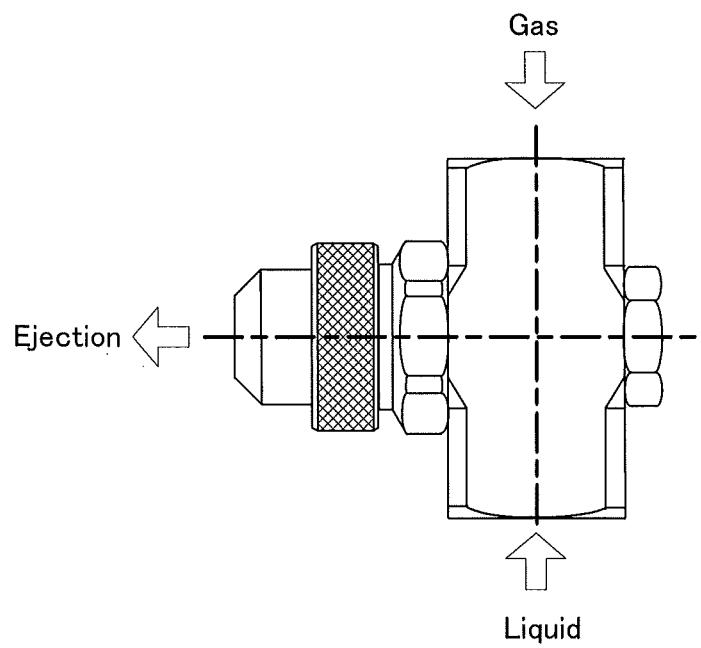
FIG. 1 is a schematic diagram showing a two-fluid nozzle, as an example of a spraying unit.

DETAILED DESCRIPTION OF THE INVENTION (Anisotropic Conductive Film and Production Method Thereof)

The anisotropic conductive film of the present invention contains a resin film, and conductive particles aligned into a monolayer in the resin film and on one plane of the resin film in the thickness direction thereof, in which a distance between the one plane of the resin film in the thickness direction thereof and a center of the conductive particle is 9 µm or less on 10-point average.

Since the conductive particles are aligned into a monolayer at one side of the resin film with respect to the thickness direction thereof and the center of the conductive particle is distant from the one side of the resin film by 9 µm or less in the anisotropic conductive film of the present invention, the conductive particles are not easily influenced from the flow of the resin at the time of the connection between the electronic part and the substrate, the high capturing rate of the particles can be assured, and thus excellent conduction reliability can be attained.

The pitch of the aligned conductive particle into a monolayer in the anisotropic conductive particle is suitably adjusted depending on the intended purpose without any restriction. As for the pitch thereof, a distance between the center of the conductive particle and the center of the adjacent conductive particle is preferably 1 µm to 30 µm, more preferably 1 µm to 15 µm, yet more preferably 1 µm to 10 µm on the 10-point average. When the pitch thereof is within the aforementioned range, the anisotropic conductive film can be sufficiently correspond to the reduction in the area of the connection terminal along with the trend for fine-pitched connection terminals, and thus is advantageous.

The production method of the anisotropic conductive film of the present invention is suitably selected depending on the intended purpose without any restriction. However, according to the conventional production method of an anisotropic conductive film, the anisotropic conductive film is formed by applying a resin composition in which conductive particles are dispersed in a resin. Therefore, it is difficult to continuously produce anisotropic conductive films at a thickness of 10 µm or less, and defects such as lines and unevenness tend to occur due to the thickened portion or clogging of the particles caused at the portion of the coating head.

In contrast, when an anisotropic conductive film is produced in accordance with the method which will be explained hereinafter, these defects can be prevented, and thus this method is advantageous. Specifically, the method for producing an anisotropic conductive film of the present invention preferably contains simultaneously spraying conductive particles, to which electrostatic potential is applied by means of an electrostatic potential applying unit, from one spraying unit, and resin particles from another spraying unit on a processing surface so as to align the conductive particles within a resin film formed of the resin particles, and may further contain suitably selected other steps, as necessary.

-Conductive Particle-

The conductive particles are suitably selected from those known in the art depending on the intended purpose without any restriction. Examples thereof include: metal particles such as of soldering, nickel and gold; and resin particles, glass particles, and ceramic particles, all of which are coated (plated) with a metal (e.g. nickel, gold, aluminum, and copper).

As for the average particle diameter of the conductive particles, the conductive particles preferably have the volume average particle diameter of 2 µm to 10 µm, more preferably 2 µm to 4 µm.

When the volume average particle diameter thereof is less than 2 µm, the classifying process thereof becomes difficult, or it is difficult to acquire such the conductive particles. When the volume average particle diameter thereof is more than 10 µm, it may be difficult to adapt to the downsizing of the joint terminals (adaption to various members requiring the fine alignments of the particles) along with the design of the connection terminal having finer pitches.

The specific gravity of the conductive particles is suitably selected depending on the intended purpose without any restriction. For example, the specific gravity thereof is preferably 1.5 to 3.0.

When the specific gravity thereof is less than 1.5, it may be difficult to secure the positioning stability of the conductive particles on the processing surface. When the specific gravity thereof is more than 3.0, the application of higher electrostatic potential may be required for aligning the conductive particles into a monolayer.

It is preferred that the conductive particles be ejected from the spraying unit in the state of slurry prepared by suspending or dispersing the conductive particles in a solvent.

The amount of the conductive particles contained in the slurry is suitably selected depending on the intended purpose without any restriction, but is preferably 20% by mass to 40% by mass.

When the amount thereof is less than 20% by mass, the duration for spraying may be prolonged, lowering the production efficiency. When the amount thereof is more than 40% by mass, the conductive particles may be easily aggregated to each other.

The solvent is suitably selected depending on the intended purpose without any restriction. Examples thereof include toluene, ethyl acetate, methylethylketones (MEK), and ethanol.

-Resin Particle-

The resin particles are formed by spraying slurry, which is prepared by dissolving a resin in a solvent, in the form of mist by means of the spraying unit.

The resin particles are sprayed on the processing surface by means of the spraying unit so that the resin particles are accumulated thereon to form a resin film. The particle diameter of the resin particles is suitably selected depending on the intended purpose without any restriction, and is preferably 4 µm to 6 µm.

When the particle diameter thereof is less than 4 µm, or more than 6 µm, it may cause disturbance in the alignment of the conductive particles.

The amount of the resin contained in the slurry is suitably selected depending on the intended purpose without any restriction, but is preferably 10% by mass to 30% by mass.

When the amount thereof is less than 10% by mass, the duration for spraying is prolonged, lowering the production efficiency. When the amount thereof is more than 30% by mass, it may be difficult to spry the mist.

The solvent is suitably selected depending on the intended purpose without any restriction. Suitable examples thereof include toluene, ethyl acetate, methylethyl ketone (MEK), and ethanol.

The resin particles (the resin film formed of the resin particles) are preferably formed of at least one insulating resin selected from an epoxy resin and an acrylic resin.

The epoxy resin is suitably selected depending on the intended purpose without any restriction. Examples thereof include bisphenol A epoxy resin, bisphenol F epoxy resin, and novolak epoxy resin. These may be used independently, or in combination.

The acrylic resin is suitably selected depending on the intended purpose without any restriction. Examples thereof include methyl acrylate, ethyl acrylate, isopropyl acrylate, isobutyl acrylate, epoxy acrylate, ethylene glycol diacrylate, diethylene glycol diacrylate, trimethylol propane triacrylate, dimethylol tricyclodecane diacrylate, tetramethylene glycol tetraacrylate, 2-hydroxy-1,3-diacryloxy propane, 2,2-bis[4-(acryloxymethoxy)phenyl]propane, 2,2-bis[4-(acryloxyethoxy)phenyl]propane, dicyclopentenyl acrylate, tricyclodecanyl acrylate, tris(acryloxyethyl)isocyanurate, and urethane acrylate. These may be used independently, or in combination.

In addition, examples thereof also include the compounds in which the aforementioned acrylates are replaced with methacrylates, and these may be used independently, or in combination.

The thickness of the resin film formed of the resin particles is suitably selected depending on the particle diameters of the conductive particles without any restriction, provided that the resin film enables to fix the conductive particles on the processing surface. The thickness thereof is preferably 2 µm to 20 µm.

When the thickness of the resin film is less than 2 µm, it is difficult to fix the conductive particles. When the thickness thereof is more than 20 µm, the duration for spraying is prolonged, lowering the production efficiency.

Spraying Unit-

The spraying unit has a function to spray the conductive particles and the resin particles onto the processing surface.

As for the spraying unit, at least two spraying units, including the aforementioned one spraying unit and another spraying unit, are necessary. It is necessary that the conductive particles and the resin particles are respectively and simultaneously sprayed from these separate spraying units onto the processing surface. In the case where these particles are not sprayed simultaneously, even though the conductive particles are applied with electrostatic potential by the electrostatic potential applying unit that will be mentioned later, the electronical control does not function due to the presence of the resin film, and thus there may be a case where the conductive particles are not aligned into a monolayer.

The shapes, structures, and sizes of the one spraying unit and another spraying unit may be identical to, or different from each other.

With respect to the spraying unit, the distance between the outlet for the conductive particles and the processing surface may be suitably adjusted, without any restriction, depending on the relationship between the jetting speed of the conductive particles from the spraying unit and the traveling speed of the conductive particles to the processing surface.

The traveling speed of the conductive particles to the processing surface is suitably adjusted depending on the intended purpose without any restriction, and is preferably 0.3 m/min or less.

When the traveling speed is more than 0.3 m/min, it may be difficult to form an alignment of the conductive particles at the predetermined area.

The spraying unit is suitably selected depending on the intended purpose without any restriction, provided that it enables to spray the conductive particles and the resin particles. For example, the spraying unit preferably has a nozzle.

The nozzle is suitably selected from those known in the art without any restriction in terms of the shape, structure, size, and diameter thereof. The diameter of the nozzle is preferably 0.1 mm to 1.0 mm.

When the diameter of the nozzle is less than 0.1 mm, it may be difficult to spray therefrom. When the diameter thereof is more than 1.0 mm, it may be difficult to control the diameters of the particles of the mist.

The nozzle may be a commercially available product, or the one arbitrarily produced. Examples of the commercial nozzle include a two-fluid nozzle (two-fluid spray nozzle 1/4JAUCO, manufactured by Spraying Systems Co.) shown in FIG. 1.

-Electrostatic Potential Applying Unit-

The electrostatic potential applying unit has a function to apply electrostatic potential to the conductive particles.

The electrostatic potential applying unit is preferably configured to apply electrostatic potential to the conductive particles just after jetting the conductive particles by the spraying unit. For example, the electrostatic potential applying unit is disposed adjacent to the outlet of the spraying unit for the conductive particles, and charges the conductive particles by applying a certain voltage.

The applied voltage by the electrostatic potential applying unit is suitably selected depending on the type of the conductive particles, without any restriction.

The electrostatic potential of the conductive particles applied by the electrostatic potential applying unit is suitably selected depending on the intended purpose without any restriction, and is preferably 300 V to 1,500 V.

When the degree of the electrostatic potential is less than 300 V, it may be difficult to array the conductive particles. When the degree of the electrostatic potential is more than 1,500 V, it may be difficult to control the aligned structure of the conductive particles because the conductive particles cause repulsion.

The electrostatic potential applying unit is suitably selected from those known in the art without any restriction. Examples thereof include a current applying device (DC high voltage power supply PSD-200, manufactured by Kasuga Electric Works Ltd.).

-Processing Surface-

The processing surface is a subject onto which the conductive particles are aligned into a monolayer. Examples thereof include surfaces of various members, such as a surface of the substrate, and surfaces of various films (e.g. a surface of a resin film).

The processing surface preferably has a conductive pattern. In this case, the conductive particles can be selectively aligned onto the conductive pattern. This is advantageous as the alignment of the particles is easily controlled.

The conductive pattern is suitably selected depending on the intended purpose without any restriction. Suitable examples of the material of the conductive pattern include a metal, and suitable examples of the pattern shape thereof include a line shape, and various patterns selected depending on the intended purpose.

In the aforementioned step, the conductive particles to which electrostatic potential is applied by the electrostatic potential applying unit and the resin particles are respectively and simultaneously sprayed from the separate spraying units to the processing surface, and the conductive particles are aligned into a monolayer in the resin film formed of the resin particles. As a result, the anisotropic conductive film of the present invention is obtained.

A pitch of the aligned conductive particles in the obtained anisotropic conductive film is suitably selected depending on the intended purpose without any restriction. A distance between the center of the conductive particle and the center of the adjacent conductive particle is preferably 1 µm to 30 µm, more preferably 1 µm to 15 µm, yet more preferably 1 µm to 10 µm on the 10-point average. This distance being in the aforementioned range is advantageous as the anisotropic conductive film having such the distance can be applicable for the production of various member requiring fine alignments of the particles.

As for the location of the conductive particles within the resin film, a distance between the center of the conductive particle and the processing surface is preferably 9 µm or less on the 10-point average. This distance being in the aforementioned range is advantageous as the anisotropic conductive film having such the distance can be applicable for the production of various member requiring fine alignments of the particles.

<Other Steps>

The aforementioned other steps are suitably selected depending on the intended purpose without any restriction. Examples thereof include a step for heating the resin film in which the conductive particles are aligned into a monolayer so as to evaporate the solvent therein.

An embodiment of the method for producing an anisotropic conductive film of the present invention will be explained with reference to the drawings.

Figure 2:
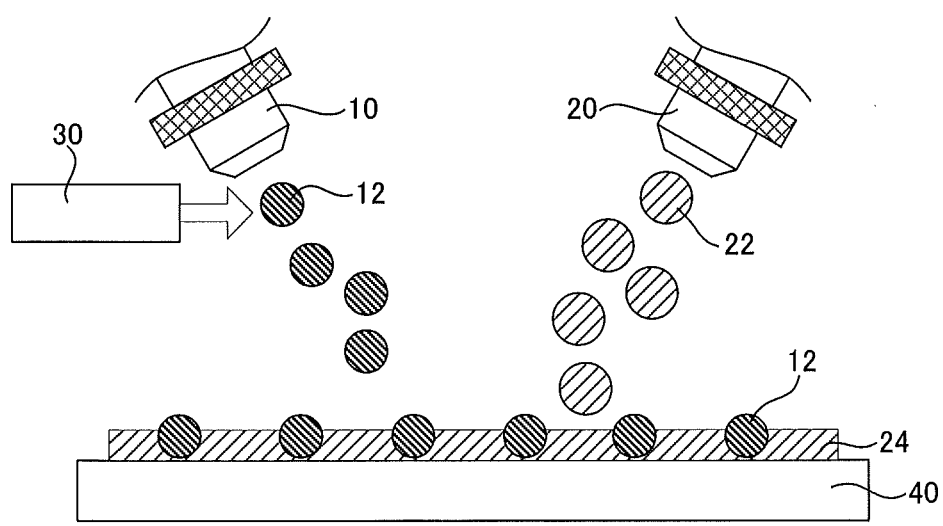
FIG. 2 is a schematic diagram showing an example of the method for producing an anisotropic conductive film of the present invention.

As shown in FIG. 2, the conductive particles 12 ejected from one spraying unit 10 and the resin particles 22 ejected from another spraying unit 20 are simultaneously sprayed onto the processing surface 40. Here, the electrostatic potential applying unit 30 is disposed between the one spraying unit 10 and the processing surface 40, and adjacent to the outlet of the one spraying unit 10 for the conductive particles 12, and a voltage is applied to the conductive particles 12 by the electrostatic potential applying unit 30, just after ejecting the conductive particles 12 from the one spraying unit 10, to thereby apply electrostatic potential to the conductive particles 12.

As the conductive particles 12 and the resin particles 22 respectively ejected from the separate spraying units (the spraying unit 10 and the spraying unit 20) are simultaneously sprayed onto the processing surface 40, the conductive particles 12 are aligned into a monolayer on the processing surface 40 without impairing the electrostatic potential thereof, and the resin particles 22 are deposited to form a resin film 24 while the positioning of the conductive particles 12 is stably secured. As a result, an isotropic conductive film in which the conductive particles 12 are aligned into a monolayer at a pitch of a micro-order within the resin film 24 and on one plane of the resin film 24 in the thickness direction thereof is obtained. In the anisotropic conductive film, a distance between the one plane of the resin film 24 in the thickness direction and the center of the conductive particle 12 is 9 µm or less on the 10-point average.

The conductive particles are aligned into a monolayer distant from one plane of the resin film with respect to the thickness direction thereof by 9 µm or less in the anisotropic conductive film of the present invention. When such the anisotropic conductive film is used for connecting an electronic part or the like and a substrate, occurrences of short circuit are prevented by suppressing the movement of the conductive particles at the time of the connection, the high capturing rate of the conductive particles is assured with a small added amount of the conductive particles, and excellent conduction reliability can be attained.

Accordingly, the anisotropic conductive film of the present invention can be suitably used for connecting various electronic parts and a substrate, or connecting a substrate and a substrate, and can be suitably used for the production of IC tags, IC cards, memory cards, flat panel displays and the like.

According to the method for producing an anisotropic conductive film of the present invention, an anisotropic conductive film in which the conductive particles are aligned into a monolayer at a pitch of micro-order within the resin film can be easily produced.

Since the anisotropic conductive film produced by the method of the present invention contains the conductive particles aligned into a monolayer at a pitch of micro-order, it can be suitably used for various fields requiring regular alignment of particles, such as a conductive substrate for fixing DNA in a DNA chip, and a conductive substrate for a development of Micro Electro Mechanical Systems (MEMS).

(Joined Structure)

The joined structure of the present invention is formed by electrically connecting at least two members of electronic parts and substrates via the anisotropic conductive film of the present invention. Specifically, the conduction between the connection terminal and the electrode, and the like, is realized by holding and crushing the conductive particles between the connection terminal of the electronic part and the electrode or connection terminal of the substrate, or between the connection terminal of the substrate and the connection terminal of the substrate.

Note that, the details of the anisotropic conductive film of the present invention are as mentioned earlier.

The electronic part is suitably selected depending on the intended purpose without any restriction. Examples thereof include IC chips, such as IC chips for controlling a liquid crystal display of a flat panel display (FPD), and LCD panels.

The substrate is suitable selected depending on the intended purpose without any restriction. Examples thereof include ITO glass substrates, flexible substrates, rigid substrates, and flexible print substrates.

The area of the connection terminal of the at least two member selected from the electronic parts and the substrates is suitably selected depending on the intended purpose without any restriction. The area thereof is preferably 600 $\mu m^2$ or more but less than 1,800 $\mu m^2$, more preferably 600 $\mu m^2$ to 1,200 $\mu m^2$, as it can be complied to the technical trend of connection terminals having fine pitches due to downsizing and higher performance of an electronic devices.

Since the joined structure of the present invention uses the anisotropic conductive film of the present invention, the joined structure has the high capturing rate of the conductive particles, and excellent conduction reliability.

EXAMPLES

Hereinafter, examples of the present invention will be explained, but these examples shall not be construed as limiting the scope of the present invention in any way.

Example 1

-Preparation of Anisotropic Conductive Film-

To 9 parts by mass of Ni—Au plated resin particles (Micropearl AU, manufactured by Sekisui Chemical Co., Ltd., having a particle diameter of 4 $\mu m$, referred as "gold particles" hereinafter) as the conductive particles, toluene was added as the solvent, to thereby prepare 40% by mass conductive particle slurry. Hereinafter, this slurry is referred as "Liquid A".

Next, 30 parts by mass of a fluid epoxy resin (bisphenol A epoxy resin) (EP828, manufactured by Japan Epoxy Resins Co., Ltd.), 30 parts by mass of a phenoxy resin (PKHH, manufactured by InChem Corporation), 1 part by mass of a silane coupling agent (A-187, manufactured by Nippon Unicar Company Limited), and 30 parts by mass of an imidazole-based latent curing agent (3941HP, manufactured by Asahi Kasei Chemicals Corporation) were mixed to thereby prepare a resin composition. To the resin composition, toluene was added as the solvent to thereby prepare 10% by mass toluene solution of the resin. Hereinafter, this toluene solution is referred as "Liquid B".

As a subject (the processing surface) for which conductive particles were aligned, a film (a PET layer) formed of polyethylene terephthalate (PET) was provided.

Next, two spraying devices to each of which a two-fluid nozzle (a two-fluid spray nozzle 1/4JAUCO, manufactured by Spraying Systems Co.) shown in FIG. 1 was connected were prepared for spraying the conductive particles and for spraying the resin particles, respectively. These devices were arranged so that the distance between the ejection outlet of the nozzle and the surface of the PET layer was to be 1 m. In addition, a charge applying device (DC high voltage power supply, PSD-200, manufactured by Kasuga Electric Works Ltd.) was arranged between the spraying device for spraying the conductive particles and the surface of the PET layer.

Then, Liquid A and Liquid B were respectively sprayed from separate nozzles by means of the spraying devices under the conditions such that each nozzle diameter was 0.6 mm, the duration for spraying was 0.5 sec., the traveling speed of the gold particles and the resin particles to the PET layer was 0.3 m/min. Here, a voltage of 500 V was applied to the gold particles, which were contained in Liquid A ejected from the nozzle, by means of the electrostatic applying device so as to provide the gold particles with electrostatic potential, and the gold particles were sprayed on the surface of the PET layer in the charged state (electrostatic potential of 300 V). Moreover, the resin particles formed by Liquid B ejected from the nozzle were sprayed and deposited on the surface of the PET layer.

As a result, an epoxy resin coated film (an anisotropic conductive film) in which the gold particles were aligned into a monolayer was formed on the surface of the PET layer.

The obtained epoxy resin coated film was heated in an oven at 60° C. for 15 minutes to as to evaporate toluene, to thereby obtain an epoxy resin film (thickness of 20 $\mu m$) in which the gold particles were aligned into a monolayer.

The location of the gold particles within the obtained epoxy resin film was measured, and it was found out that the 10 point-average of the distance, in the thickness direction of the epoxy resin film, between the surface (interface between the epoxy resin film and the PET layer) of the epoxy resin where the gold particles were present and the center of the gold particle was 5 $\mu m$.

Moreover, the space between the aligned gold particles was measured, and it was found out that the 10-point average of the distance between the center of the gold particle and the center of the adjacent particle was 10 $\mu m$.

Example 2

-Preparation of Anisotropic Conductive Film-

An anisotropic conductive film of Example 2 was formed in the same manner as in Example 1, provided that the compositions of the slurry of the conductive particles (Liquid A) and the toluene solution of the resin (Liquid B) of Example 1 were respectively changed to the following compositions.

To 10 parts by mass of Ni—Au plated resin particles (Micropearl AU, manufactured by Sekisui Chemical Co., Ltd., having a particle diameter of 4 $\mu m$) as the conductive particles, toluene was added as the solvent, to thereby prepare a 40% by mass conductive particle slurry.

Liquid B was prepared as follow. At first, 35 parts by mass of a fluid epoxy resin (bisphenol A epoxy resin) (3002A, manufactured by Kyoeisha Chemical Co., Ltd.), 45 parts by mass of a phenoxy resin (PKHH, manufactured by InChem Corporation), 2 parts by mass of a silane coupling agent (A-172, manufactured by Nippon Unicar Company Limited), and 8 parts by mass of an radical initiator (PERHEXA 3M, manufactured by NOF Corporation) were mixed to thereby prepare a resin composition. To the resin composition, toluene was added as the solvent to thereby prepare 10% by mass toluene solution of the resin.

As a result, an acrylic resin film (an anisotropic conductive film) in which the gold particles were aligned into a monolayer was formed on the surface of the PET layer. The location of the cold particles within the acrylic resin film was measured and it was found out that the 10 point-average of the distance, in the thickness direction of the acrylic resin film, between the surface (interface between the acrylic resin film and the PET layer) of the acrylic resin where the gold particles were present and the center of the gold particle was 5 μm.

Moreover, the space between the aligned gold particles was measured, and it was found out that the 10-point average of the distance between the center of the gold particle and the center of the adjacent particle was 10 μm.

Comparative Example 1

-Preparation of Anisotropic Conductive Film-

An imidazole latent curing agent (40 parts by mass) (3941HP, manufactured by Asahi Kasei Chemicals Corporation), 14 parts by mass of a fluid epoxy resin (bisphenol A epoxy resin) (EP828, manufactured by Japan Epoxy Resins Co., Ltd.), 35 parts by mass of a phenoxy resin (PKHH, manufactured by InChem Corporation), and 1 part by mass of a slane coupling agent (A-187, manufactured by Nippon Unicar Company Limited) were mixed. Into this mixture, 10 parts by mass of Ni—Au plated resin particles (Micropearl AU, manufactured by Sekisui Chemical Co., Ltd., having a particle diameter of 4 μm) was dispersed to thereby prepare a conductive particle-containing resin composition.

The obtained conductive particle-containing resin composition was applied onto a film (PET layer) formed of polyethylene terephthalate (PET) by means of a bar coater, to thereby prepare an epoxy resin coated film (an anisotropic conductive film) having a thickness of 20 μm.

The obtained epoxy resin coated film was heated in an oven at 60° C. for 15 minutes so as to evaporate toluene, to thereby obtain an epoxy resin film in which the gold particles were dispersed.

The location of the gold particles within the obtained epoxy resin film was measured, and it was found out that the 10 point-average of the distance, in the thickness direction of the epoxy resin film, between the surface (interface between the epoxy resin film and the PET layer) of the epoxy resin and the center of the gold particle was 15 μm.

Moreover, the space between the aligned gold particles was measured, and it was found out that the 10-point average of the distance between the center of the gold particle and the center of the adjacent particle was 40 μm.

(Preparation of Joined Structure 1)

A joined structure of an evaluation chip A or an evaluation chip B, and a ITO patterned glass was formed using the anisotropic conductive film of each of Examples 1 and 2 and Comparative Example 1.

[Evaluation Chip A]
Material: silicon, Size: 20 mm×2 mm, Thickness: 0.5 mm
Bump: gold-plated bump, Thickness of bump: 15 μm, Number of bumps: 800 per chip, Bump size: 30 μm×150 μm, Space between bumps: 18 μm

[Evaluation Chip B]
Material: silicon, Size: 15 mm×13 mm, Thickness: 0.5 mm
Bump: gold-plated bump, Thickness of bump: 15 μm, Number of bumps: 700 per chip, Bump size: 30 μm×140 μm, Space between bumps: 6 μm

[ITO Patterned Glass]
Thickness: 0.7 mm

The evaluation chip A or evaluation chip B and the ITO patterned glass were laminated with the anisotropic conductive film being therebetween in such a manner that the side of the anisotropic conductive film where the conductive particles were present was placed on the side of the evaluation chip where the bums were present, and another side of the anisotropic conductive film was placed on the side of the ITO patterned glass where the conductive pattern was present, so that the bumps and the conductive pattern faced to each other. Then, the laminate was pressed at 80 MPa per chip for 10 seconds and at the heating temperature of 180° C. or 200° C. so as to contact bonding each layers of the laminate, to thereby obtain a joined structure.

Figure 3A:
FIG. 3A is a SEM photograph of the cross-section of the joined structure produced by using the anisotropic conductive film of Example 1.
Figure 3B:
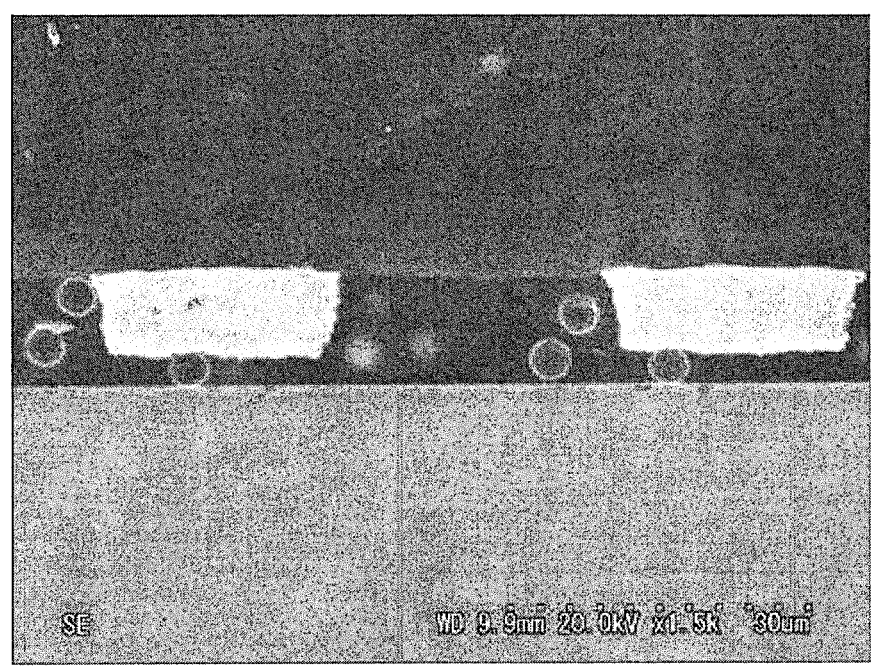
FIG. 3B is a SEM photograph of the cross-section of the joined structure producing by using the anisotropic conductive film of Comparative Example 1.

A SEM photograph of the cross-section of the joined structure in which the evaluation chip A and the ITO patterned glass were contact bonded via the anisotropic conductive film of Example 1 was shown in FIG. 3A, and a SEM photograph of the cross-section of the joined structure in which the evaluation chip A and the ITO patterned glass were contact bonded via the anisotropic conductive film of Comparative Example 1 was shown in FIG. 3B.

As shown in FIG. 3A, the gold particles in the anisotropic conductive film of Example 1 were aligned into a monolayer at a short distance from one side of the film in the thickness direction thereof, and thus the capturing rate of the conductive particles, which contributed to the conduction, was significantly improved.

On the other hand, as shown in FIG. 3B, the gold particles in the anisotropic conductive film of Comparative Example 1 were dispersed within the film, and thus they tended to be easily influenced by the flow of the resin at the time of contact bonding the evaluation chip A and the ITO patterned glass, resulting that the such the anisotropic conductive film had a low capturing rate of the conductive particles, which contributed to the conduction.

<Conduction-Resistance Test of Chip on Glass (COG)>

Next, each of the obtained joined structures was subjected to the measurement of the value of the resistance between the conductive patterns in accordance with a 4-probe method based on the specifications of JEITA EIAJ ED-4701, and then evaluated based on the following criteria. The results for the evaluation chip A are shown in Table 1, and the results for the evaluation chip B are shown in Table 2.

[Evaluation Criteria]

A: The value of resistance just after contact bonding was 5Ω or less, and no short circuit was occurred.

B: The value of resistance just after contact bonding was more than 5Ω, and short circuit was occurred.

TABLE 1

| | Chip | | | | | |
| --- | --- | --- | --- | --- | --- | --- |
| | Evaluation Chip A | | | | | |
| | Temperature for contact bonding (° C.) | | | | | |
| | 180 | | | 200 | | |
| | Anisotropic conductive film | | | | | |
| | Ex. 1 | Ex. 2 | Comp. Ex. 1 | Ex. 1 | Ex. 2 | Comp. Ex. 1 |
| Evaluation of conduction resistance | A | A | A | A | A | A |

TABLE 2

| | Chip Evaluation Chip B Temperature for contact bonding (° C.) | | | | | |
|---|---|---|---|---|---|---|
| | 180 | | | 200 | | |
| | Anisotropic conductive film | | | | | |
| | Ex. 1 | Ex. 2 | Comp. Ex. 1 | Ex. 1 | Ex. 2 | Comp. Ex. 1 |
| Evaluation of conduction resistance | A | A | B | A | A | B |

From the results shown in Tables 1 and 2, it was confirmed that the use of the anisotropic conductive films obtained in Examples 1 and 2 provided joined structures each having a low conduction resistance just after contact bonding, and realized the connection of the chip and the ITO patterned glass without causing short circuits. Since the conductive particles obtained in Examples 1 and 2 were aligned into a monolayer at a short distance from one plane of the film with respect to the thickness direction thereof, the conductive particles, which would contribute to the conduction, could be surely captured even in the case where a space between the bumps was short, such as the case of the evaluation chip B having the bump space of 6 μm.

On the other hand, when the anisotropic conductive film obtained in Comparative Example 1 was used, the joined structure, in which the evaluation chip A (bump space of 18 μm) and the ITO patterned glass was contact bonded, had a low conduction resistance just after contact bonding, and the chip and the ITO patterned glass could be connected without causing short circuits. However, in the case of the joined structure in which the evaluation chip B and the ITO patterned glass were contact bonded via the anisotropic conductive film of Comparative Example 1, it was confirmed that the joined structure had a high conduction resistance just after contact bonding, and short circuits were occurred. Since the conductive particles were dispersed in the film without being aligned into a monolayer in the anisotropic conductive film of Comparative Example 1, the conductive particles, which would contribute to the conduction, could not be captured in the case where the space between the bumps was short, such as the case of the evaluation chip B having the bump space of 6 μm.

(Preparation of Joined Structure 2)

Joined structures were each prepared by contact bonding the evaluation chip A and the Ito patterned glass respectively using the anisotropic conductive film of Example 1 and that of Comparative Example 1, in the same manner as in the preparation of the joined structure 1.

(Preparation of Joined Structure 3)

Joined structures were each prepared by contact bonding the evaluation chip A and the Ito patterned glass respectively using the anisotropic conductive film of Example 1 and that of Comparative Example 1, in the same manner as in the preparation of the joined structure 1, provided that the heating temperature was changed to 170° C. or 190° C.

<Conduction-Resistance Reliability Test of Chip on Glass (COG)>

Next, each of the joined structures obtained in the preparation of the joined structure 2 and the preparation of the joined structure 3 was subjected to the measurement of the value of the resistance between the conductive patterns in accordance with a 4-probe method based on the specifications of JEITA EIAJ ED-4701. The value of the resistance was measured just after conduct bonding the evaluation chip A and the ITO patterned glass, and after aging (250 hours later, 500 hours later, and 1,000 hours later) at 80° C. and 85% RH, and the results were evaluated based on the following criteria. The results for the evaluation are shown in Table 3.

[Evaluation Criteria]

A: The value of the resistance was 5Ω or less just after contact bonding, and the value thereof after aging was three times or less the value thereof just after contact bonding.

B: The value of the resistance was 5Ω or less just after contact bonding, but the value thereof after aging was more than three times the value thereof just after contact bonding.

TABLE 3

| | | Preparation of Joined Structure 2 | | | | Preparation of Joined Structure 3 | | | |
|---|---|---|---|---|---|---|---|---|---|
| | | Temperature for contact bonding (° C.) | | | | | | | |
| | | 180 | | 200 | | 170 | | 190 | |
| | | Anisotropic conductive film | | | | | | | |
| | | Ex. 1 | Comp. Ex. 1 | Ex. 1 | Comp. Ex. 1 | Ex. 2 | Comp. Ex. 1 | Ex. 2 | Comp. Ex. 1 |
| Evaluation for conduction resistance | Just after contact bonding | A | A | A | A | A | A | A | A |
| | 250 hours later | A | B | A | B | A | B | A | B |
| | 500 hours later | A | B | A | B | A | B | A | B |
| | 1,000 hours later | A | B | A | B | A | B | A | B |

From the results shown in Table 3, it was found that the anisotropic conductive films of Examples 1 and 2 had low resistance in the joined structure after aging, exhibited sufficient electronic characteristic on practical use, and provided excellent connection reliability. On the other hand, the anisotropic conductive film of Comparative Example 1 had the resistance three times larger in 250 hours time, compared to the resistance thereof just after contact bonding. Such the joined structure cannot be used as a product, and is inferior in the practical use.

As has been mentioned above, the anisotropic conductive film of the present invention can be formed by simultaneously spraying conductive particles and resin particles by means of spraying units. Therefore, the multilayer lamination performed in the conventional production method of the anisotropic conductive film is not necessary, thus a significant cost down is expected due to reduction in the number of the production steps.

Moreover, the bump space correspondable to the anisotropic conductive film of the present invention was 6 μm, and the bump area correspondable thereto was 600 μm$^2$. To compare with this, the bump space correspondable to the conventional anisotropic conductive film was 18 μm, and the bump area correspondable thereto was 1,800 μm$^2$. Therefore, it was found that the anisotropic conductive film of the present invention is sufficiently respondable for the trends for the bumps having finer pitchs.

Moreover, the joined structure using the anisotropic conductive film of the present invention has a high capturing rate (the particle capturing rate per unit area of the bump) of the conductive particles, that is approximately 98%, whereas the conventional joined structure has a low capturing rate of the conductive particles, that is approximately 40%. Even though the anisotropic conductive film of the present invention contains a small amount of the conductive particles compared to the conventional anisotropic conductive film, i.e. about ½ to about ⅕ of the amount thereof in the conventional film, the anisotropic conductive film of the present invention has a high capturing rate of the conductive particles. Therefore, it was found that excellent conduction reliability can be attained at low cost, according to the present invention. Note that the joined structure formed by using the anisotropic conductive film of the present invention has the same degree of the strength to that of the joined structure formed by the conventional anisotropic conductive film in the die shear reliability test, and thus has a sufficient strength.

Example 3

To Ni—Au plated resin particles (Micropearl AU, manufactured by Sekisui Chemical Co., Ltd., having a particle diameter of 4 μm, referred as "gold particles" hereinafter) as the conductive particles, toluene was added as the solvent, to thereby prepare 100 g of 30% by mass conductive particle slurry. Hereinafter, this slurry is referred as "Liquid A".

Next, to a bisphenol A epoxy resin (fluid epoxy resin) (EP828, manufactured by Japan Epoxy Resins Co., Ltd.), toluene was added as the solvent to thereby prepare 100 g of 20% by mass toluene solution of the resin. Hereinafter, this toluene solution is referred as "Liquid B".

As a subject (the processing surface) for which conductive particles were aligned, a film (a PET layer) formed of polyethylene terephthalate (PET) was provided.

Next, two spraying devices to each of which a two-fluid nozzle (a two-fluid spray nozzle 1/4JAUCO, manufactured by Spraying Systems Co.) shown in FIG. 1 was connected were prepared for spraying the conductive particles and for spraying the resin particles, respectively. These devices were arranged so that the distance between the ejection outlet of the nozzle and the surface of the PET layer was to be 1 m. In addition, a charge applying device (DC high voltage power supply, PSD-200, manufactured by Kasuga Electric Works Ltd.) was arranged between the spraying device for spraying the conductive particles and the surface of the PET layer.

Then, Liquid A and Liquid B were respectively sprayed from separate nozzles by means of the spraying devices under the conditions such that each nozzle diameter was 0.6 mm, and the spraying speed was 0.3 m/min. Here, a voltage of 500 V was applied to the gold particles, which were contained in Liquid A ejected from the nozzle, by means of the electrostatic applying device so as to provide the gold particles with electrostatic potential, and the gold particles were sprayed on the surface of the PET layer in the charged state (electrostatic potential of 300 V). Moreover, the resin particles formed by Liquid B ejected from the nozzle were sprayed and deposited on the surface of the PET layer.

As a result, an epoxy resin coated film (a film containing aligned particles) in which the gold particles were aligned into a monolayer was formed on the surface of the PET layer.

The obtained epoxy resin coated film was heated in an oven at 70° C. for 5 minutes to as to evaporate toluene, to thereby obtain an epoxy resin film in which the gold particles were aligned into a monolayer. Then, a transparent PET layer (a cover film) was laminated on the surface of the epoxy resin film.

Examples 4 to 6

The epoxy resin films of Examples 4 to 6 in each of which gold particles were aligned into a monolayer in the epoxy resin were prepared by simultaneously spraying the slurry of the gold particles (Liquid A) and the toluene solution of the epoxy resin (Liquid B) from the separate nozzles on the PET layer in the same manner as in Example 3, provided that, in each Example, the nozzle diameter and the applied voltage from the charge applying device were changed as shown in Table 4.

Figure 4A:
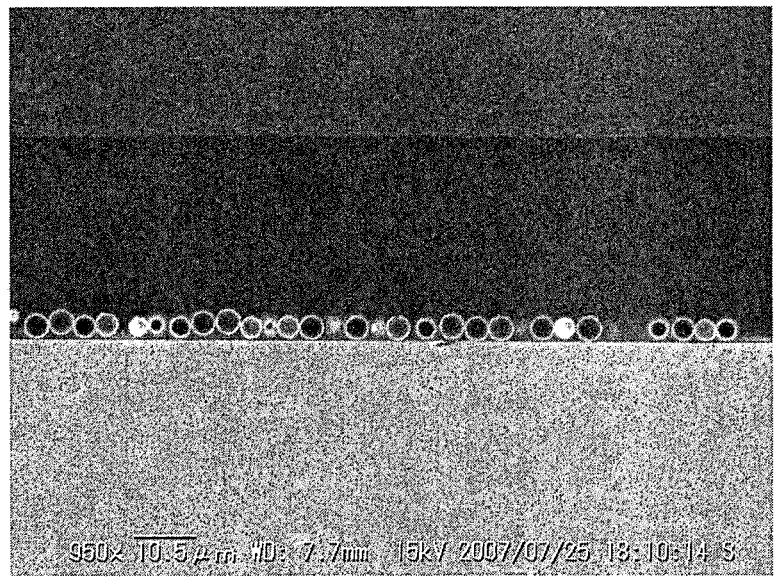
FIG. 4A is a SEM photograph showing the alignment state of the gold particles contained in the epoxy resin film of Example 4.
Figure 4B:
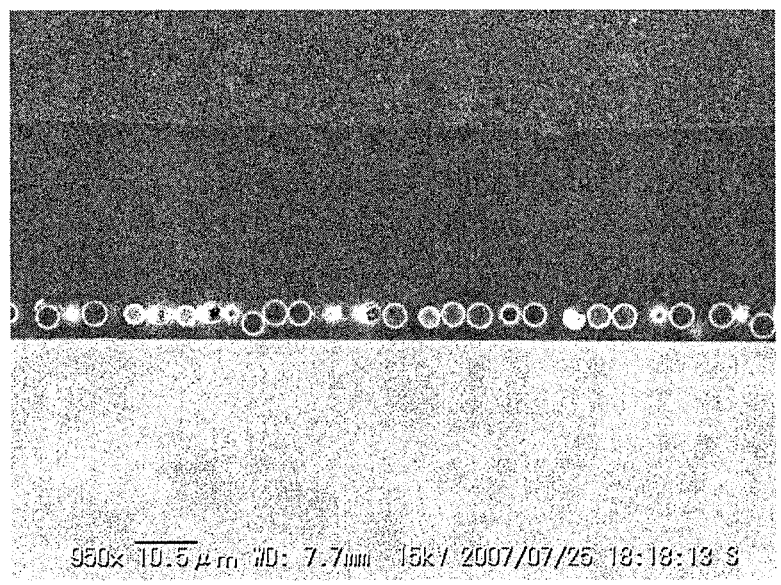
FIG. 4B is a SEM photograph showing the alignment state of the gold particles contained in the epoxy resin film of Example 5.

The SEM photograph of the cross section of the epoxy resin film obtained in Example 4 is shown in FIG. 4A, and that of the epoxy resin film obtained in Example 5 is shown in FIG. 4B. In FIGS. 4A and 4B, the cross section has a three-layer structure, and the lowermost layer is the processing surface (PET layer), the uppermost layer is the cover film (PET layer), and the intermediate layer is the epoxy resin film in which the gold particles are aligned into a monolayer.

From FIGS. 4A and 4B, it was found that the gold particles were aligned into a monolayer adjacent to the PET layer (the lowermost layer) in the thickness direction of the epoxy resin film. In addition, it was confirmed that the gold particles were aligned into a monolayer, with hardly any distance from the surface of the PET layer in FIG. 4A (Example 4), and that the epoxy resin layer was formed between the surface of the PET layer and the gold particles with a thickness of a few micrometers in FIG. 4B (Example 5).

The pitch of the aligned gold particles was measured, and it was found that the distance between the center of the gold particle and the center of the adjacent gold particle was 4 μm in FIG. 4A (Example 4), and was 5 μm in FIG. 4B (Example 5) on the 10-point average.

The location of the gold particles within the epoxy resin film was also measured, and it was found that the distance between the center of the gold particle and the surface of the PET layer (the uppermost layer) was 3 μm in FIG. 4A (Example 4), and was 5 μm in FIG. 4B (Example 5) on the 10-point average. In this manner, the distance between the center of the conductive particle and the processing surface could be changed by the order of a few micrometers by controlling the diameter of the nozzle and the applied voltage from the charge applying device.

Comparative Examples 2 to 3

Only the slurry of the gold particles (Liquid A) was sprayed on the surface of the PET layer in the same manner as in Example 3, provided that the toluene solution of the bisphenol A epoxy resin (Liquid B) was not sprayed, and the diameter of the nozzle and the applied voltage from the charge applying device were changed as shown in Table 4.

Comparative Example 4

The slurry of the gold particles (Liquid A) and the toluene solution of the epoxy resin (Liquid B) were simultaneously sprayed on the surface of the PET layer using the separate nozzles in the same manner as in Example 3, provided that no voltage was applied by the charge applying device and thus the gold particles did not have electrostatic potential.

Comparative Example 5

The epoxy resin film formed in the same manner as in Example 3, provided that the toluene solution of the bisphenol A epoxy resin (Liquid B) was not sprayed, and Liquid B was applied onto the PET layer so as to coat the PET layer with Liquid B. Then, onto a surface of this epoxy resin film, the slurry of the gold particles (Liquid A) was sprayed at the same conditions to the conditions in Example 3.

Comparative Example 6

The slurry of the gold particles (Liquid A) and the toluene solution of the epoxy resin (Liquid B) were sprayed on the surface of the PET layer as in Example 3, provided that Liquid A and Liquid B were sprayed from one nozzle, and a voltage was applied to both Liquid A and Liquid B by the charge applying device.

Example 7

An epoxy resin film in which gold particles were aligned into a monolayer within the epoxy resin was prepared by simultaneously spraying slurry of gold particles (Liquid A) and a toluene solution of an epoxy resin (Liquid B) on a surface of a PET layer from separate nozzles in the same manner as in Example 3, provided that the gold particles (Micropearl AU, manufactured by Sekisui Chemical Co., Ltd., having a particle diameter of 4 μm) as the conductive particles were replaced with Ni—Au plated resin particles (Micropearl AUH, manufactured by Sekisui Chemical Co., Ltd., having a particle diameter of 4 μm, referred as "gold particles" hereinafter).

Example 8

An epoxy resin film in which gold particles were aligned into a monolayer within the epoxy resin was prepared by simultaneously spraying slurry of gold particles (Liquid A) and a toluene solution of an epoxy resin (Liquid B) on a surface of a PET layer from separate nozzles in the same manner as in Example 3, provided that the gold particles (Micropearl AU, manufactured by Sekisui Chemical Co., Ltd., having a particle diameter of 4 μm) as the conductive particles were replaced with Ni—Au plated resin particles (Bright GNR, manufactured by Nippon Chemical Industrial Co., Ltd., having a particle diameter of 5 μm, referred as "gold particles" hereinafter).

Example 9

An epoxy resin film in which gold particles were aligned into a monolayer within the epoxy resin was prepared by simultaneously spraying slurry of nickel particles (Liquid A) and a toluene solution of an epoxy resin (Liquid B) on a surface of a PET layer from separate nozzles in the same manner as in Example 3, provided that the gold particles (Micropearl AU, manufactured by Sekisui Chemical Co., Ltd., having a particle diameter of 4 μm) as the conductive particles were replaced with nickel plated resin particles (Bright NR, manufactured by Nippon Chemical Industrial Co., Ltd., having a particle diameter of 4 μm, referred as "gold particles" hereinafter).

Example 10

An acrylic resin film in which gold particles were aligned into a monolayer within the acrylic resin was prepared by simultaneously spraying slurry of gold particles (Liquid A) and a toluene solution of an acrylic resin (Liquid B) on a surface of a PET layer from separate nozzles in the same manner as in Example 3, provided that the bisphenol epoxy resin (EP828, manufactured by Japan Epoxy Resins Co., Ltd.) as the insulating resin was replaced with an acrylic resin (epoxy acrylate, 3002A, manufactured by Kyoeisha Chemical Co., Ltd.).

Example 11

An acrylic resin film in which gold particles were aligned into a monolayer within the acrylic resin was prepared by simultaneously spraying slurry of gold particles (Liquid A) and a toluene solution of an acrylic resin (Liquid B) on a surface of a PET layer from separate nozzles in the same manner as in Example 3, provided that the bisphenol epoxy resin (EP828, manufactured by Japan Epoxy Resins Co., Ltd.) as the insulating resin was replaced with an acrylic resin (dimethyloltricyclodecane diacrylate, DCP-A, manufactured by Kyoeisha Chemical Co., Ltd.).

Next, the aligned states of the conductive particles of Examples 3 to 11 and Comparative Examples 2 to 6 were observed under a scanning electron microscope (SEM), and were evaluated based on the following criteria. The results are shown in Tables 4 and 5.

[Evaluation Criteria]
A: the conductive particles were aligned into a monolayer.
B: the conductive particles were aligned into a monolayer, but part of the alignment was disturbed.
C: the conductive particles were aggregated each other, and were not aligned into a monolayer.

TABLE 4

|  | Ex. 3 | Ex. 4 | Ex. 5 | Ex. 6 | Comp. Ex. 2 | Comp. Ex. 3 | Comp. Ex. 4 |
| --- | --- | --- | --- | --- | --- | --- | --- |
| Nozzle diameter (mm) | 0.6 | 0.8 | 1.0 | 0.5 | 0.1 | 0.3 | 0.6 |

TABLE 4-continued

|  | Ex. 3 | Ex. 4 | Ex. 5 | Ex. 6 | Comp. Ex. 2 | Comp. Ex. 3 | Comp. Ex. 4 |
|---|---|---|---|---|---|---|---|
| Applied voltage (V) | 500 | 1,000 | 1,800 | 400 | 100 | 200 | — |
| Electrostatic potential (V) | 300 | 800 | 1,500 | 250 | 80 | 100 | — |
| Conductive particles | Gold M-AU | Gold M-AU | Gold M-AU | Gold M-AU | Gold M-AU | Gold M-AU | Gold M-AU |
| Insulating resin | Bis-A epoxy | Bis-A epoxy | Bis-A epoxy | Bis-A epoxy | No spraying | No spraying | Bis-A epoxy |
| Aligned state | A | A | A | B | C | C | C |

Note that, in Table 4, "Gold" denotes gold particles, "M-AU" denotes Micropearl AU, and "Bis-A epoxy" denotes bisphenol A epoxy.

TABLE 5

|  | Comp. Ex. 5 | Comp. Ex. 6 | Ex. 7 | Ex. 8 | Ex. 9 | Ex. 10 | Ex. 11 |
|---|---|---|---|---|---|---|---|
| Nozzle diameter (mm) | 0.6 | 0.6 (one nozzle) | 0.6 | 0.6 | 0.6 | 0.6 | 0.6 |
| Applied voltage (V) | 500 | 500 | 500 | 500 | 500 | 500 | 500 |
| Electrostatic potential (V) | 300 | 300 | 300 | 300 | 300 | 300 | 300 |
| Conductive particles | Gold M-AU | Gold M-AU | Gold M-AUH | B-GNR | Nickel B-NR | Gold M-AU | Gold M-AU |
| Insulating resin | No spraying *1 | Bis-A epoxy | Bis-A epoxy | Bis-A epoxy | Bis-A epoxy | Epoxy acrylate | Dimethylol tricyclodecane diacrylate |
| Aligned state | C | C | A | A | A | A | A |

In Table 5, *1 means that the epoxy resin film was formed in advance, "Gold" denotes gold particles, "Nickel" denotes nickel particles, "M-AU" and "M-AUH" respectively denote Micropearl AU and Micropearl AUH, "B-GNR" and "B-NR" respectively denote Bright GNR and Bright NR, and "Bis-A epoxy" denotes bisphenol A epoxy.

From the results shown in Tables 4 and 5, it was found that the conductive particles were fixed in the insulating resin film in the state such that they are aligned into a monolayer in Examples 3 to 11, as the conductive particles and the insulating resin particles were simultaneously sprayed by using separate nozzles, respectively.

Figure 5:
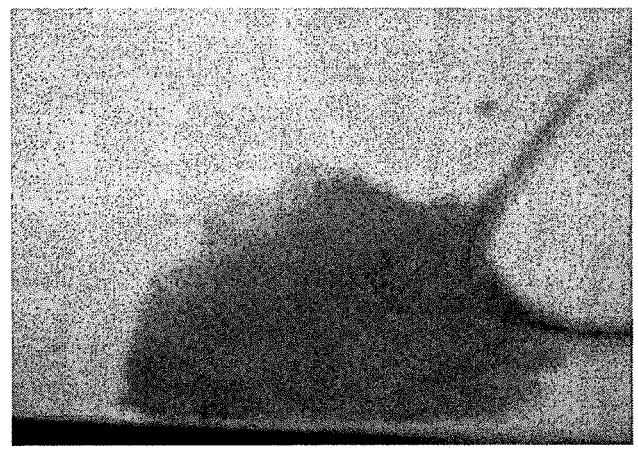
FIG. 5 is a photograph showing the alignment state of the gold particles of Comparative Example 2.
Figure 6:
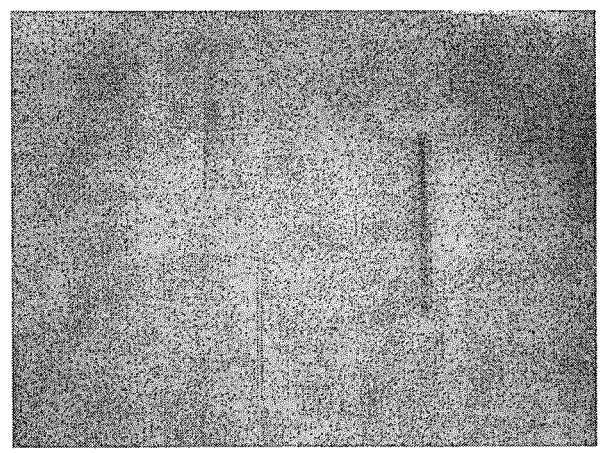
FIG. 6 is a photograph showing the alignment state of the gold particles of Comparative Example 3.
Figure 7A:
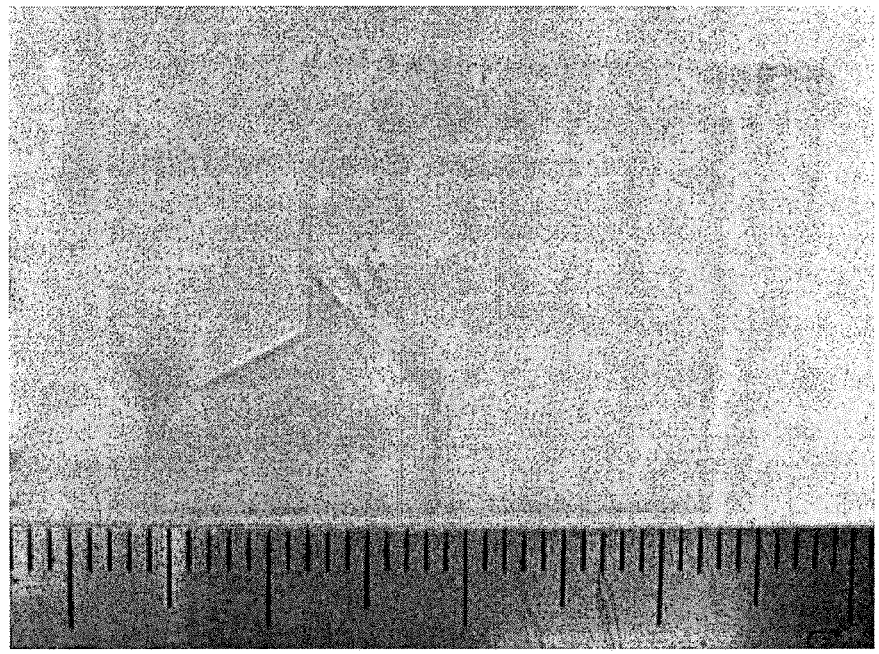
FIG. 7A is a photograph (part 1) showing the alignment state of the gold particles of Example 20.
Figure 7B:
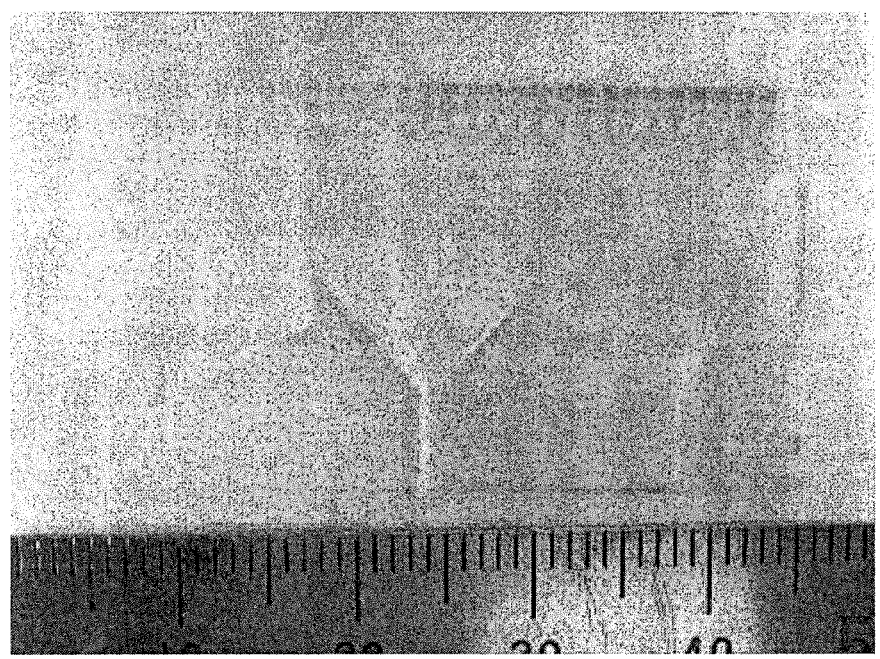
FIG. 7B is a photograph (part 2) showing the alignment state of the gold particles of Example 20.
Figure 7C:
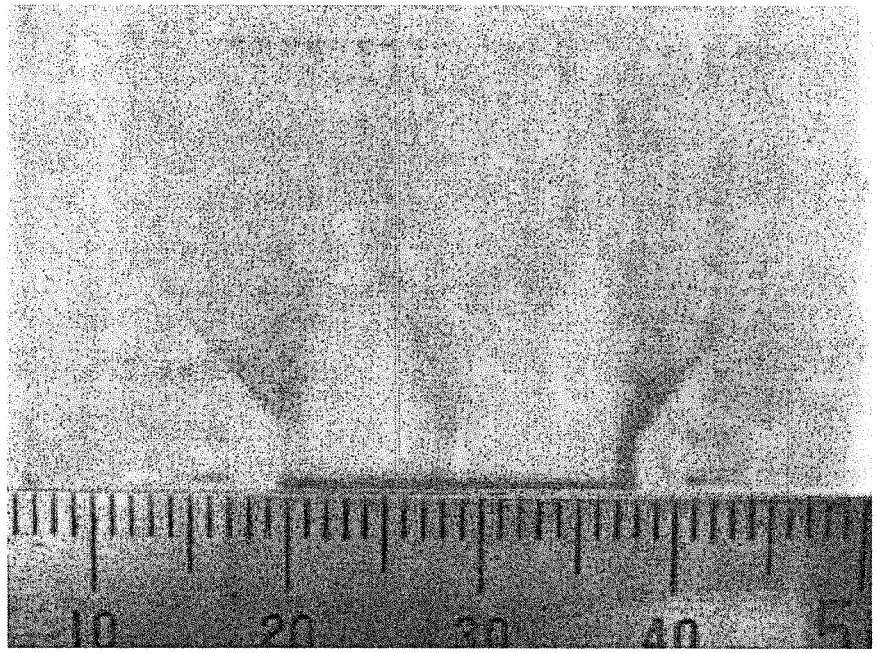
FIG. 7C is a photograph (part 3) showing the alignment state of the gold particles of Example 20.
Figure 7D:
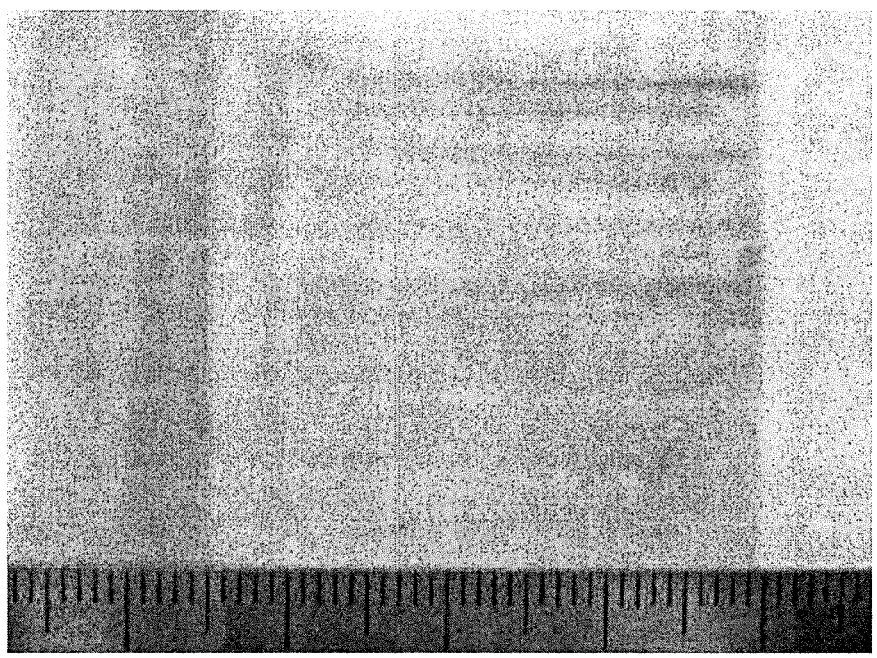
FIG. 7D is a photograph (part 4) showing the alignment state of the gold particles of Example 20.

On the other hand, in Comparative Examples 2 to 3, only the conductive particles to which the electrostatic potential was applied were sprayed without spraying the insulating resin particles, and thus the conductive particles were not fixed by the insulating resin, losing the electrostatic potential of the conductive particles within about 15 seconds. Therefore, the conductive particles could not be aligned. The aligned state of the conductive particles of Comparative Example 2 is shown in FIG. 5, and that of Comparative Example 3 is shown in FIG. 6. As shown in FIGS. 5 and 6, the alignment of the conductive particles is hardly seen in both of Comparative Examples 2 and 3. Especially in Comparative Example 2 (see FIG. 5), it was considered that some kind of aggregation be occurred as the applied voltage was low.

Moreover, in Comparative Example 4, the conductive particles were aggregated as no electrostatic potential was applied to the conductive particles, and thus the conductive particles could not be aligned into a monolayer.

In Comparative Example 5, the insulating resin particles were not sprayed at the same time as the conductive particles, in stead, only the conductive particles were sprayed onto an insulating resin film previously formed by applying an insulating resin. Therefore, the electric control could not be possible because of the presence of the insulating rein film, and the control for the fine alignment of the particles could not be performed.

In Comparative Example 6, the conductive particles could not be aligned into a monolayer, as the conductive particles and the insulating resin particles were both ejected from the same one nozzle, and the electrostatic potential was applied both of them.

Examples 12 to 19

The aligned states of the conductive particles were observed when the diameter of the nozzle and/or the electrostatic potential of the conductive particles were changed.

Specifically, an epoxy resin film in which gold particles were aligned into a monolayer within the epoxy resin was formed by simultaneously spraying slurry of gold particles (Liquid A) and a toluene solution of an acrylic resin (Liquid B) on a surface of a PET layer from separate nozzles in the same manner as in Example 3, provided that the diameter of the nozzle and the applied voltage from the charge applying device were changed as shown in Tables 6 and 7. Then, the aligned state of the conductive particles was observed under a scanning electron microscope (SEM), and was evaluated based on the aforementioned evaluation criteria. The results are shown in Tables 6 and 7. For comparing the differences in the aligned states depending on the quantity of the electrostatic potential without changing the diameter of the nozzle, the results of Examples 3, 5 and 6 are also presented below for reference.

TABLE 6

|  | Ex. 3 | Ex. 12 | Ex. 19 | Ex. 13 | Ex. 17 | Ex. 14 | Ex. 18 |
|---|---|---|---|---|---|---|---|
| Nozzle diameter (mm) |  | 0.6 |  |  | 0.1 |  | 0.3 |
| Applied voltage (V) | 500 | 1,800 | 2,000 | 500 | 100 | 500 | 200 |
| Electrostatic potential (V) | 300 | 1,500 | 1,600 | 300 | 80 | 300 | 100 |
| Conductive particles | Gold M-AU | Gold M-AU | Gold M-AU | Gold M-AU | Gold M-AU | Gold M-AU | Gold M-AU |
| Insulating resin | Bis-A epoxy | Bis-A epoxy | Bis-A epoxy | Bis-A epoxy | Bis-A epoxy | Bis-A epoxy | Bis-A epoxy |
| Aligned state | A | A | B | A | B | A | B |

In Table 6, "Gold" denotes gold particles, "M-AU" denotes Micropearl AU, and "Bis-A epoxy" denotes bisphenol A epoxy.

TABLE 7

|  | Ex. 6 | Ex. 15 | Ex. 5 | Ex. 16 |
|---|---|---|---|---|
| Nozzle diameter(mm) |  | 0.5 |  | 1.0 |
| Applied voltage(V) | 400 | 500 | 1,800 | 500 |
| Electrostatic potential(V) | 250 | 300 | 1,500 | 300 |
| Conductive particles | Gold particles Micropearl AU | Gold particles Micropearl AU | Gold particles Micropearl AU | Gold particles Micropearl AU |
| Insulating resin | Bisphenol A epoxy | Bisphenol A epoxy | Bisphenol A epoxy | Bisphenol A epoxy |
| Aligned state | B | A | A | A |

From the results shown in Tables 6 and 7, it was found that the aligned state of the conductive particles changed as the diameter of the nozzle and/or the applied voltage changed.

Comparing Example 12 and Example 19, the conductive particles were neatly aligned into a monolayer in Example 12 (electrostatic potential of 1,500 V), but the conductive particles were burned as the electrostatic potential was high in Example 19 (electrostatic potential of 1,600 V) though the conductive particles were partially aligned into a monolayer, and thus it was found that the anisotropic conductive film of Example 19 was inferior to that of Example 12 in practicality. Based on these results, it was made clear that the upper limit of the numerical range suitable for the electrostatic potential existed somewhere between 1,500 V to 1,600 V.

Example 20

Slurry of gold particles (Liquid A) and a toluene solution of an epoxy resin (Liquid B) were simultaneously sprayed from separate nozzles on a silicon substrate having a metal wiring in the form of a pattern on a surface thereof in the same manner as in Example 4, provided that as a subject (processing surface) to which the conductive particles were aligned, the silicon substrate was used. As a result, the gold particles were selectively aligned on the metal wiring formed on the silicon substrate into a monolayer as shown in FIGS. 7A to 7D, to thereby obtain a pattern formed of the gold particles having the same pattern as the metal wiring.

The anisotropic conductive film of the present invention can suitably used for connecting various electronic parts and a substrate, or a substrate and a substrate, or any other combination, and can suitably used for the production of IC tags, IC cards, memory cards, flat panel display and the like.

The joined structure of the present invention has the high capturing rate of the conductive particles, and excellent conduction reliability.

The method for producing an anisotropic conductive film of the present invention can easily form a film containing aligned particles, in which conductive particles are aligned into a monolayer within the resin film at a pitch of micro order.

What is claimed is:

1. A method for producing an anisotropic conductive film, comprising:
   simultaneously spraying conductive particles, to which electrostatic potential is applied by means of an electrostatic potential applying unit, from one spraying unit, and resin particles from another spraying unit on a processing surface so as to align the conductive particles within a resin film formed of the resin particles;
   wherein the resin particles are formed of at least one insulating resin selected from an epoxy resin and an acrylic resin;
   wherein the electrostatic potential of the conductive particles is in the range of 300 V to 1,500 V;
   wherein the conductive particles sprayed from the spraying unit travel to the processing surface at the speed of 0.3 m/min or slower.

2. The method for producing the anisotropic conductive film according to claim 1, wherein the spraying unit contains a nozzle.

3. The method for producing the anisotropic conductive film according to claim 1, wherein a distance between a center of the conductive particle and a center of the adjacent conductive particle in the resin film is 1 μm to 30 μm based on 10-point average.

4. The method for producing the anisotropic conductive film according to claim 1, wherein a distance between a center of the conductive particle in the resin film and the processing surface is 9 μm or less based on 10-point average.

5. The method for producing the anisotropic conductive film according to claim 1, wherein the processing surface has a conductive pattern, and the conductive particles are selectively aligned on the conductive pattern.

6. The method for producing the anisotropic conductive film according to claim 2, wherein the nozzle has a diameter of 0.1 mm to 1.0 mm.

* * * * *